United States Patent
Wang et al.

(10) Patent No.: US 10,605,855 B2
(45) Date of Patent: Mar. 31, 2020

(54) METHOD, TEST LINE AND SYSTEM FOR DETECTING SEMICONDUCTOR WAFER DEFECTS

(71) Applicant: Taiwan Semiconductor Manufacturing Co., Ltd., Hsinchu (TW)

(72) Inventors: Jing-Sen Wang, Hsinchu (TW); Yuan-Yao Chang, Kaohsiung County (TW); Hung-Chi Chiu, Hsinchu County (TW); Chia-Wei Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 241 days.

(21) Appl. No.: 15/688,889

(22) Filed: Aug. 29, 2017

(65) Prior Publication Data

US 2019/0064250 A1 Feb. 28, 2019

(51) Int. Cl.
*G01R 31/26* (2020.01)
*H01L 21/66* (2006.01)
*G01R 31/28* (2006.01)

(52) U.S. Cl.
CPC .......... *G01R 31/2621* (2013.01); *H01L 22/14* (2013.01); *H01L 22/34* (2013.01); *G01R 31/2831* (2013.01)

(58) Field of Classification Search
None
See application file for complete search history.

(56) References Cited

U.S. PATENT DOCUMENTS

| | | | | |
|---|---|---|---|---|
| 4,701,922 A * | 10/1987 | Kuboki | .......... | G01R 31/318558 714/731 |
| 6,128,219 A * | 10/2000 | Pio | ..................... | G11C 16/0433 365/185.05 |
| 9,230,871 B1 * | 1/2016 | Wang | ..................... | H01L 22/34 |
| 2005/0052298 A1 * | 3/2005 | Moon | .................. | H03M 1/687 341/135 |
| 2007/0103826 A1 * | 5/2007 | Hung | ..................... | H02H 9/046 361/56 |
| 2009/0099819 A1 * | 4/2009 | Logan | ..................... | H01L 22/14 702/185 |
| 2011/0050275 A1 * | 3/2011 | Mollat | ............... | G01R 31/2884 324/762.05 |

* cited by examiner

*Primary Examiner* — Nasima Monsur
(74) *Attorney, Agent, or Firm* — JCIPRNET (57) ABSTRACT

A method, a test line and a system for detecting defects on a semiconductor wafer are presented. The method includes measuring a current-voltage (IV) curve of a plurality of metal oxide semiconductor (MOS) transistors which are connected in series in a test key; comparing the measured IV curve with a reference curve to obtain a first drain current drop in a linear region and a second drain current drop in a saturation region; and determining whether at least one of the MOS transistor among the MOS transistors of the test key is defected according to at least one of the first drain current drop and the second drain current drop.

20 Claims, 9 Drawing Sheets

METHOD, TEST LINE AND SYSTEM FOR DETECTING SEMICONDUCTOR WAFER DEFECTS

BACKGROUND

During integrated circuit (IC) manufacturing on semiconductor wafer, wafer-level testing plays a crucial role to guarantee the quality of the ICs, particularly as the hot spots such as voids and defects (e.g., polysilicon voids (PO voids), dummy polysilicon voids (DPO voids) and work function metal (WFM)) become more critical for yield with technology evolution (e.g., miniaturization, dimension shrink). In the known approaches, after the semiconductor wafer is completed through the semiconductor processing and prior to the dicing process of the ICs from the semiconductor wafer, Wafer Acceptance Test (WAT) is performed to determine whether the semiconductor wafer meet criteria for an acceptable wafer.

For example, when manufacturing ICs including metal oxide semiconductor (MOS) transistors on a semiconductor wafer, the test line in scribe lines of the semiconductor wafer are tested, wherein each test line may have few MOS transistors (e.g., 4 MOS transistors), and the drain terminal and the gate terminal of the MOS transistors in a test line are electrically connected to each other. In the known approaches, the threshold voltage (Vth) and drain current when the MOS transistors in a saturation mode (Idsat) are monitored to determine the defects (e.g., voids) of the ICs.

However, since there are few MOS transistors (e.g., 4 transistors) per a test line and the gate terminal and the drain terminal of the MOS transistors in each of the test line are electrically connected to each other, the testing speed is slow and the accuracy is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
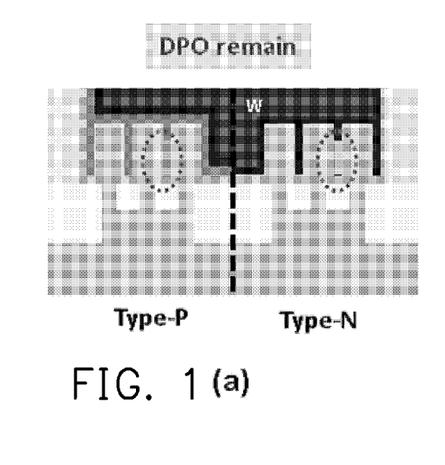
FIGS. 1(a), 1(b) and 1(c) depict examples of detects and a method for detecting defects in semiconductor wafer.

During manufacturing a semiconductor wafer, defects such as DPO remain and WFM remain may occurred between the fin-like gate terminals in the MOS transistors of the ICs, as shown in FIGS. 1(a) and 1(b), and the defects usually cause high threshold voltage (Vth), as indicated by the arrow shown in FIG. 1(c). Based on this characteristic, in the present disclosure, a methodology is developed to raise up detectability of the defects by monitoring drain current drops in the linear region and the saturation regions of IV curves of the plurality of the MOS transistors.

In the present disclosure, a test line with a plurality of test keys connected in parallel is provided, where each of the test keys includes a plurality of MOS transistors connected in series, and thus a large number of MOS transistors are configured in the test line for test. The number of MOS transistor to be disposed in each of the test key may be appropriately determined according to specific criteria, thereby balancing the observability and detectability of the semiconductor wafer testing.

Figure 2:
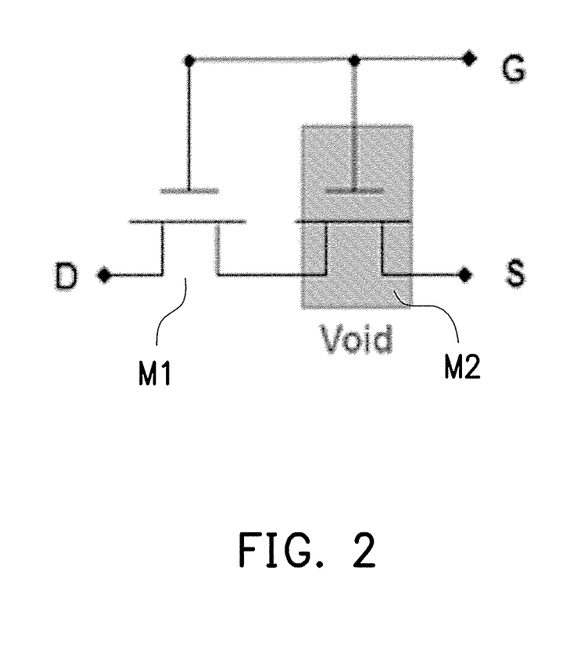
FIG. 2 depicts an example of MOS transistors in a test key in accordance with some embodiments of the present disclosure.

FIG. 2 depicts an example of two MOS transistors M1 and M2 in a test key in accordance with some embodiments of the present disclosure. Each of the MOS transistors M1 and M2 has four terminals, a source terminal 'S', a drain terminal 'D', a gate terminal 'G', and a body terminal 'B', where the source terminal S and the body terminal B are electrically connected to each other. The MOS transistors M1 and M2 are electrically connected in series, in which the gate terminal of MOS transistor M1 are electrically connected to the gate terminal of MOS transistor M2, and the source/body terminal of the MOS transistor M1 is electrically connected to the drain terminal of the MOS transistor M2.

In an example shown in FIG. 2, the MOS transistor M2 may have defects (e.g., voids) occurred during the manufacturing process of the semiconductor wafer, and these defects should be detected during testing process to guarantee the quality of the semiconductor wafer.

Figure 3:
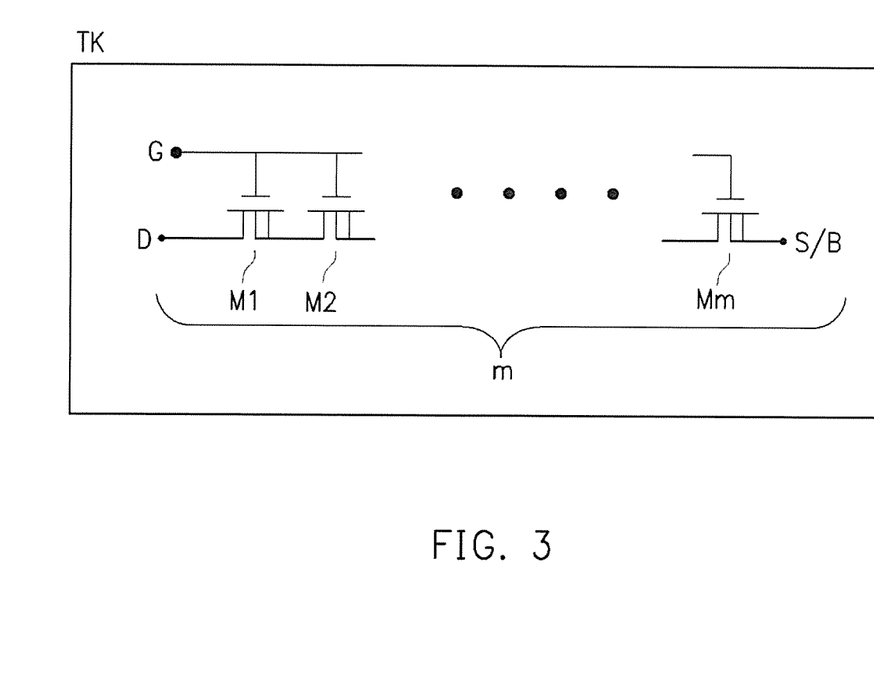
FIG. 3 depicts an example of a test key in accordance with some embodiments of the present disclosure.

FIG. 3 depicts an example of a test key in accordance with some embodiments of the present disclosure. Referring to FIG. 3, a test key TK includes a plurality of MOS transistors M1 to Mm, where m is an integer. The test key TK can be used for WAT monitor methodology, but the disclosure is not limited thereto. The MOS transistors M1 to Mm are electrically connected in series, and the gate terminal of each of the MOS transistors M1 to Mm is electrically isolated from the drain terminal of each of the MOS transistors M1 to Mm.

The number of the MOS transistors in the test key TK needs to be carefully selected to balance the testing speed and testing accuracy. If too many MOS transistors are configured in each of the test keys TK, observability is low and it is more difficult for accurately determining the defects. Otherwise, the observability is high but the detectability is low (i.e. less MOS transistors can be tested at a time). In some embodiments, the number of the MOS transistors in the test key TK is determined according to predetermined criteria, for example, a relation between an order of a drain current drop detected by applying a gate voltage to a gate terminal of each of the MOS transistors in the test key and the number of the MOS transistors in the test key. However, the disclosure is not limited thereto, the number of the MOS transistors in the test key TK can be determined according to different methods and techniques.

Figure 4:
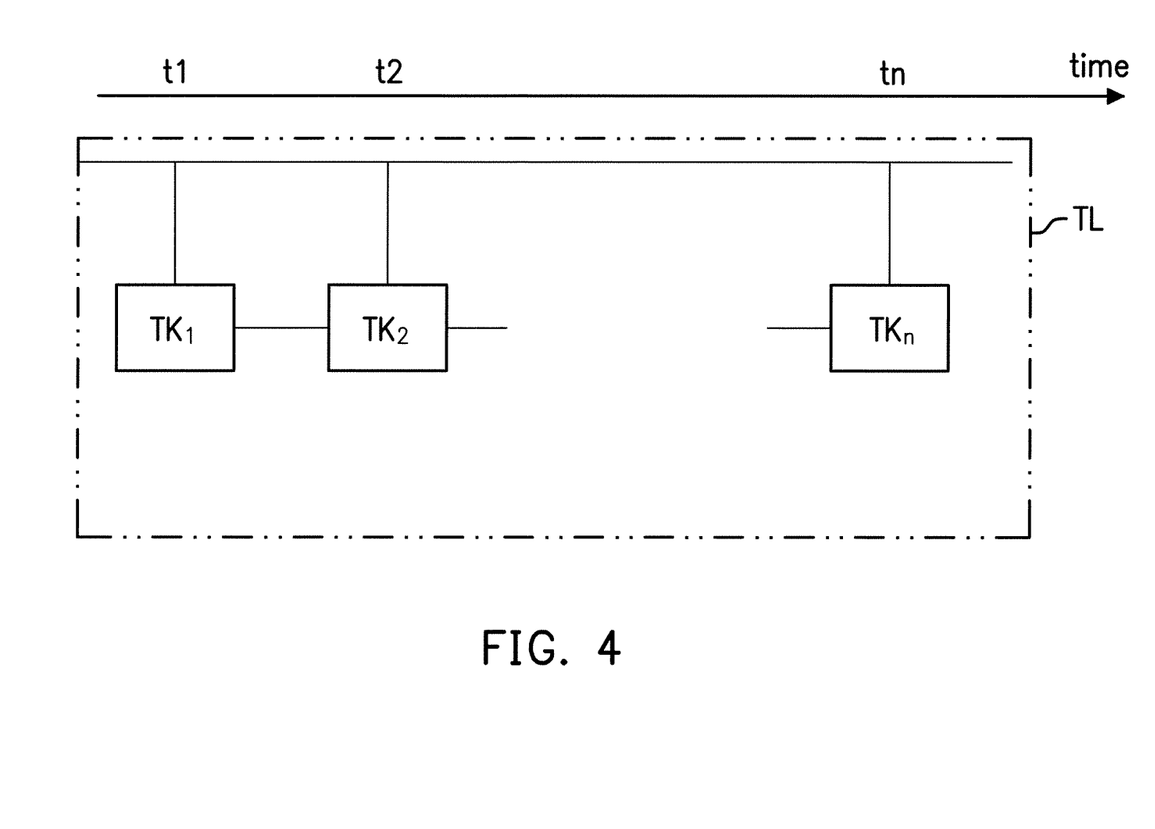
FIG. 4 depicts an example of a test line in accordance with some embodiments of the present disclosure.

FIG. 4 depicts an example of a test line in accordance with some embodiments of the present disclosure. Referring to FIG. 4, a test line TL comprises a plurality of test keys TK1 to TKn. The test keys TK1 to TKn of the test line TL are electrically connected in parallel. It should be noted that the number n of the test keys TK1 to TKn in the test line TL can be any integer number. In some embodiments, the number of test keys TK1 to TKn in the test line TL may be determined according to statistical method, but the disclosure is not limited thereto.

FIG. 4 further depicts a time axis that indicates that time point to which the corresponding test key is enabled for testing. For example, the test key TK1 is enabled for testing at time point t1, the test key TK2 is enabled for testing at time point t2, and the test key TKn is enabled for testing at time point tn. In some embodiments, the test keys TK1 to TKn have the same number of MOS transistors and the period for testing each of the test keys TK1 to TKn in the test line TL is the same. In some embodiments, the number of MOS transistors in one of the test keys in the test line TL can be different from the number of MOS transistors in another one of the test key in the test line TL, and the period for testing one of the test keys can be different from the period for testing another one of the test keys.

In some embodiments, D flip-flops are used to control the enable time point for each of the test keys TK1 to TKn. The D flip-flops may be electrically connected to the test key TK1 to TKn respectively, so as to sequentially enable the test keys TK1 to TKn for testing. For example, the D flip-flops may be configured as a delay circuit to sequentially enable the test keys TK1 to TKn in the test line TL. In some embodiments, in addition to the D flip-flops, any other circuit or component (e.g., delaying circuit) can be used to control the time point for enabling the test keys TK1 to TKn in the test line TL.

Table 1 shows comparison of the conventional wafer defect detection methodology and an exemplary embodiment of the present application. Referring to Table 1, the conventional wafer defect detection methodology arranges 4 MOS transistors per test line TL which is corresponding to approximately 200 MOS transistors per wafer. The testing speed of the conventional methodology is 4 MOS transistors per second.

TABLE 1

| Methodology | MOS/TL | MOS/sec | MOS/wfr |
| --- | --- | --- | --- |
| Conventional | 4 | 4 | ~200 |
| Present application | >5040 | 420X | 1260X |

According to the exemplary embodiment of the present application, each test key may comprise 10 MOS transistors connected in series, and each of the test line TL may have 504 test keys or more connected in parallel. As such, each test line TL may have more than 5040 MOS transistors for testing. As a result, the number of MOS transistors per wafer of the exemplary embodiment is 1260 times more than that of the conventional method, and the testing speed of the exemplary embodiment is 420 times faster than that of the conventional methodology. In other words, the exemplary embodiment of the present application may significantly improve the performance of wafer testing in comparison with the conventional methodology.

Figure 5:
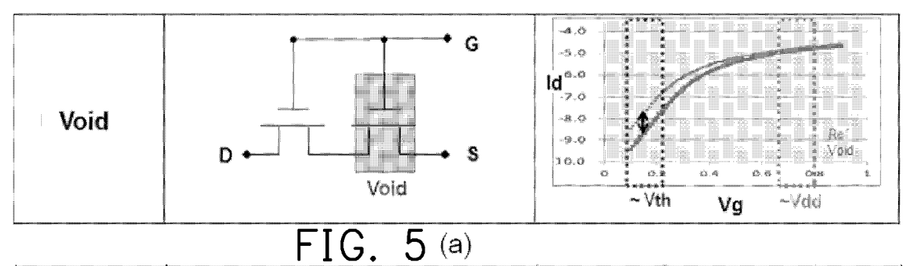
FIGS. 5(a) to 5(c) depict examples of defects and the current-voltage curves (IV curves) corresponding to the defects in accordance with some embodiments of the present disclosure.

FIGS. 5(a) to 5(c) depict an example of three types of defects and the IV curves corresponding to each of the defects in accordance with some embodiments of the present disclosure. FIG. 5(a) shows a first type of defects (void) in at least one of the MOS transistors in the test key and the corresponding IV curves (a reference IV curve of non-defected MOS transistors and the void IV curve where void is occurred in at least one of the MOS transistors). When there is a void in at least one of the MOS transistors in the test key, the drain current in a linear region drops significantly and the drain current in the saturation region changes insignificantly (or may remain unchanged). In other words, if the first drain current drop in the linear region is significant (e.g., Id drop is greater than a first threshold) and the second drain current drop in the saturation region is insignificant (Id drop is smaller than a predetermined threshold), then it may determine that there is a void in at least one of the MOS transistors. In this way, the void occurred in the MOS transistors of the test key may be detected according to the first drain current drop and the second drain current drop.

FIG. 5(b) depicts a second type of defects (e.g., opening/floating gate terminal of MOS transistors) and the corresponding IV curves (a reference IV curve of non-defected MOS transistors and the IV curve where floating/opening gate is occurred in at least one of the MOS transistors).

When the gate terminal of at least one of the MOS transistors in the test key is opening or floating, the drain current in the linear region changes insignificantly and the drain current in the saturation region drops significantly. In other words, if the first drain current drop in the linear region is insignificant (e.g., Id drop is smaller than a predetermined threshold) and the second drain current drop in the saturation region is significant (Id drop is greater than a second threshold), then it may determine that the gate terminal of at least one MOS transistor in the test key is opening/floating. In this way, the defects of MOS transistors due to opening/floating gate terminal can be detected according to the first drain current drop and the second drain current drop.

FIG. 5(c) depicts a third type of defects (e.g., a high internal connection resistance between the MOS transistors)

and the corresponding IV curves (a reference IV curve of non-defected MOS transistors and the IV curve where the internal connection resistance between MOS transistors is high).

When the internal connection resistance between the MOS transistors in the test key is high, the drain current in the linear region drops significantly and the drain current in the saturation region drops significantly as well. In other words, if the first drain current drop in the linear region is significant (e.g., Id drop is greater than a first threshold) and the second drain current drop in the saturation region is significant (Id drop is greater than a second threshold), then it may determine that the internal connection resistance between the MOS transistors in the test key is high. In this way, the defects of MOS transistors due to high internal connection resistance can be detected according to the first drain current drop and the second drain current drop.

Table 2 summarizes the method for detecting defects in the ICs of the semiconductor wafer according to the drain current drop. When there is a significant Id drop in the linear region and an insignificant Id changes in the saturation region, it is determined that voids occur in at least one of the MOS transistors. When there is an insignificant Id change in the linear region and a significant Id drop in the saturation region, it is determined that opening/floating gate terminal occurs in at least one of the MOS transistors. When there is a significant Id drop in the linear region and a significant Id drop in the saturation region, it is determined that high internal connection resistance between MOS transistors occurs.

TABLE 2

| Defects | Id drop in linear region | Id drop in saturation region |
| --- | --- | --- |
| Void | Id drop | |
| Opening/floating gate | | Id drop |
| Internal connection resistance (HRc) | Id drop | Id drop |

By measuring the IV curve of the MOS transistors and comparing the measured IV curve with a reference IV curve, the present application may detect the MOS transistor's defects such as voids, opening/floating gate terminal, and high internal connection resistance according to the drain drop currents in the linear region and the saturation region of the IV curve. Accordingly, the present application may quickly and accurately determine the defects in the ICs of the semiconductor wafer.

Figure 6:
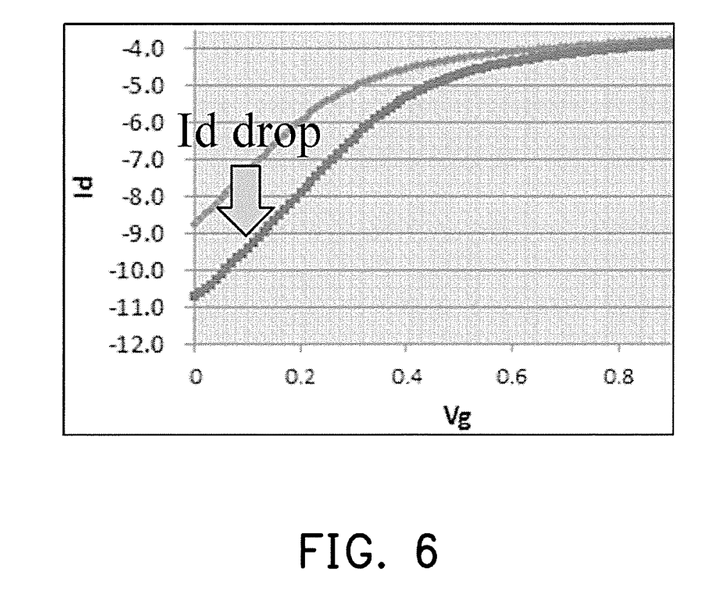
FIG. 6 depicts a chart view of Id drop in accordance with some embodiments of the present disclosure.

FIG. 6 depicts a chart view of Id drop in accordance with some embodiments of the present disclosure. FIG. 6 shows a reference IV curve of non-defected MOS transistors and a defected IV curve of defected MOS transistors. The drain current drop (Id drop) is determined according to the ratio of the drain current of the reference IV curve and the corresponding drain current in the defected IV curve. Mathematically, the Id drop may be calculated according to the equation (1) below:

$$Id\ drop = \frac{Id_{ref}}{Id_{defect}} \quad (1)$$

Where Id drop is the drain current drop value, $Id_{ref}$ is drain current value of the reference IV curve, and $Id_{defect}$ is the corresponding drain current value of the defected IV curve.

Figure 7:
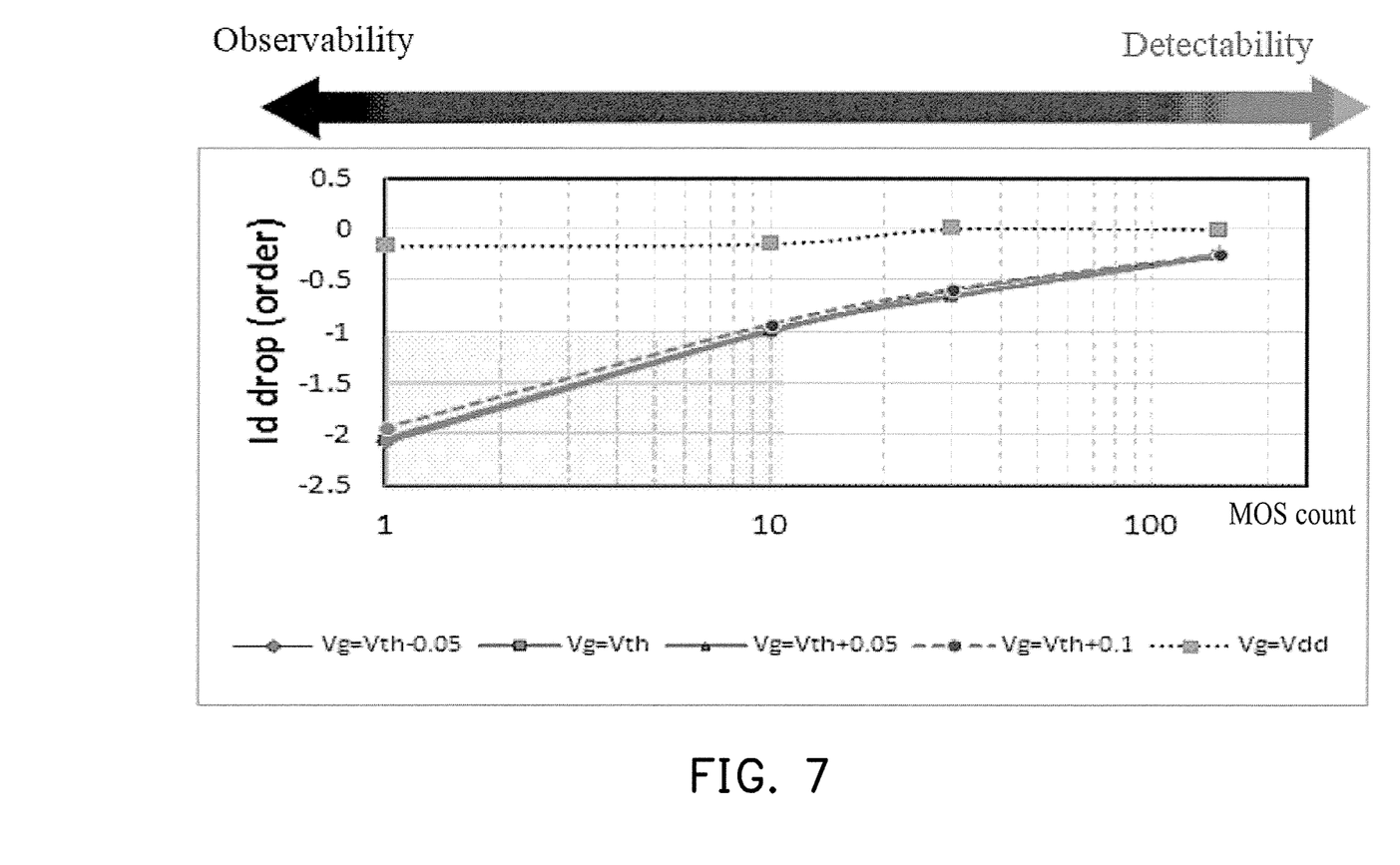
FIG. 7 depicts a chart view for selecting the number of MOS transistors in each of the test keys in accordance with some embodiments of the present disclosure.

FIG. 7 depicts a chart view for selecting the number of MOS transistors in each of the test keys in accordance with some embodiments of the present disclosure. Referring to FIG. 7, a relation between a drain current (Id) drop order detected by applying a gate voltage (Vg) to a gate terminal of each of the MOS transistors in the test key and the number of the MOS transistors in the test key is shown. The vertical axis of the chart shown in FIG. 7 represents the Id drop order and the horizontal axis of the chart shown in FIG. 7 represents the number of MOS transistors per device under test (DUT) (or the number of MOS transistors per test key).

In some embodiments, the Id drop order may be obtained by performing a logarithm operation on the Id drop value. For an example, at a specific value of Vg, if the drain current $Id_{ref}$ measured when none of the MOS transistors in the test key is defected is $10^{-6}$ A and the drain current $Id_{defect}$ measured when at least one of the MOS transistors in the test key is defected is $10^{-8}$ A, the Id drop order will be $-2$.

As shown in FIG. 7, when less MOS transistors are configured in each of the test key, the observability is higher but the detectability (i.e. testing speed) is slower. On the other hand, when more MOS transistors are configured in each of the test key, the observation is lower but the detectability is faster. Therefore, it is necessary to determine the number of MOS transistors in each of the test key to balance the observability and detectability for the defects. In some embodiments, the number of MOS transistors in each of the test key is determined according to the Id drop order having an observability over a predetermined level.

As the example shown in FIG. 7, the ID drop order is set as "−1", the voltage Vg is set as the threshold voltage Vth of the MOS transistors. In some embodiments, the values of Id drop order and the voltage Vg may be selected based on desired requirements, and should not be limited to the values shown in FIG. 7.

Figure 8:
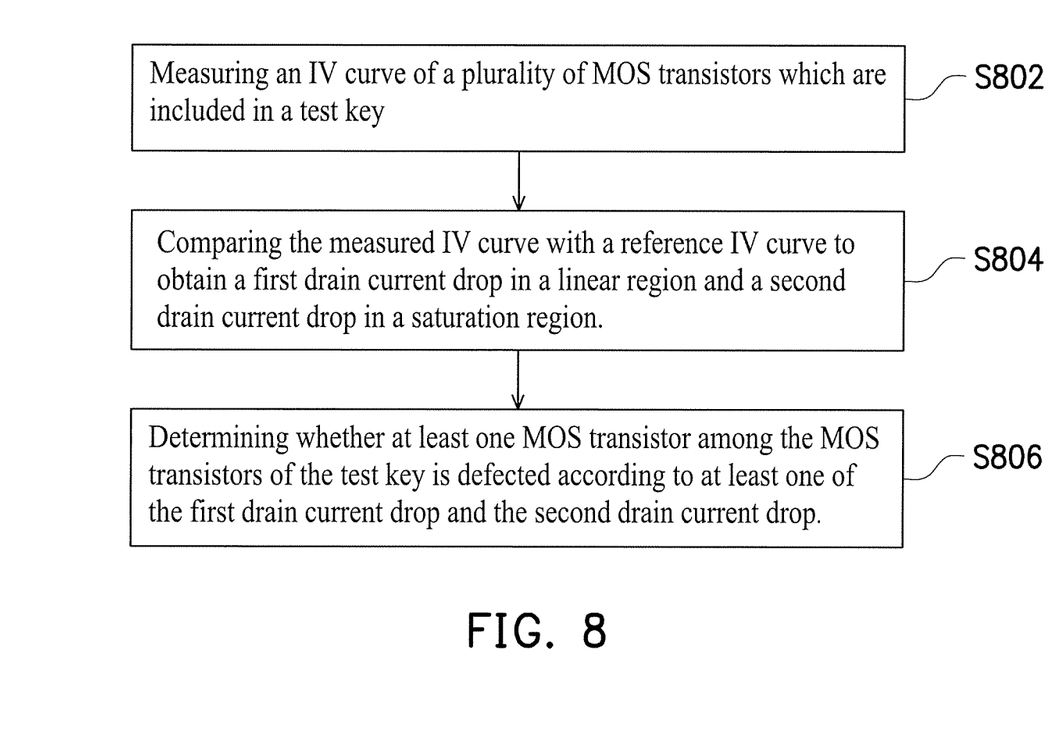
FIG. 8 depicts a flowchart diagram of wafer defect detection method in accordance with some embodiments of the present disclosure.

FIG. 8 depicts a flowchart diagram of wafer defect detection method in accordance with some embodiments of the present disclosure. In step S802, the method measures an IV curve of a plurality of MOS transistors which are included in a test key. In step S804, the method compares the IV curve with a reference IV curve to obtain a first drain current drop in the linear region and a second drain current drop in the saturation region. In some embodiments, the method may respectively measures the IV curve of the plurality of MOS transistors in the linear region and in the saturation region instead of the IV curve in all range. The drain current drops may be obtained by equation (1), but the disclosure is not limited thereto. In steps S806, the method determines whether at least one MOS transistor among the MOS transistors of the test key is defected according to at least one of the first drain current drop and the second drain current drop. The defects capable of being determined include a void, a floating/opening gate, and high internal connection resistance.

Figure 9:
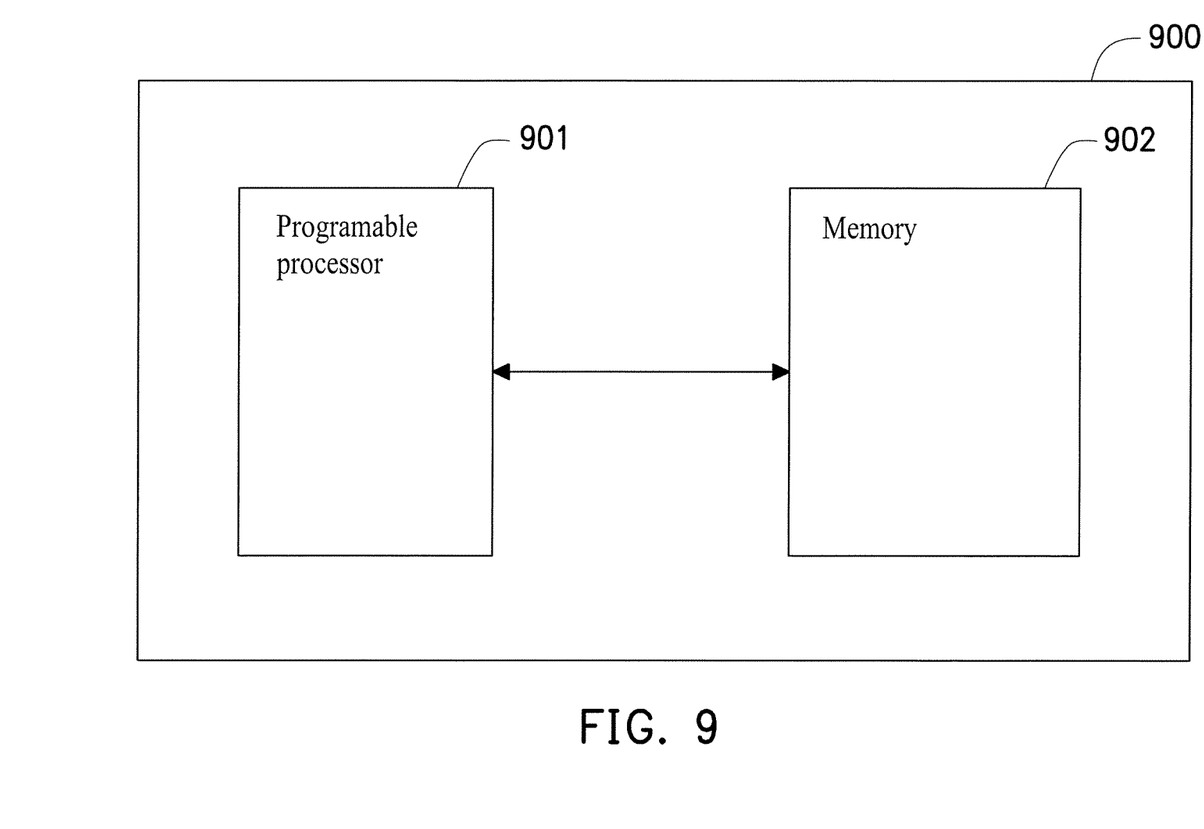
FIG. 9 depicts a block diagram of the wafer monitoring system in accordance with some embodiments of the present disclosure.

FIG. 9 depicts a block diagram of the wafer monitoring system 900 in accordance with some embodiments of the present disclosure. The wafer monitoring system 900 may include a programmable processor 901 and a memory 902.

The programmable processor 901 is, for example, a single processor or multiple processors to perform the exemplary image processing method, but the number of the processors does not limit the disclosure. In some embodiments, the processor is a micro-controller unit (MCU), a central processing unit (CPU), a digital signal processor (DSP), a programmable controller, application specific integrated circuits (ASIC), a programmable logic device (PLD), or other similar devices.

The memory 902 is, for example, RAM, flash memory, ROM, EPROM, EEPROM, registers, hard disk, a removable disk, a CD-ROM, or any other form of machine or computer readable storage medium. The memory 902 can be coupled to the processor 901 such that the processor 901 can read information from, and write information to, the memory 902. In the alternative, the memory 902 can be integral to the processor 901.

The memory 902 may store executable program instructions, and the executable program instructions are configured, when executed by the programmable processor, to cause the system 900 to: provide a test line which includes a plurality of test keys electrically connected in parallel, and sequentially test each of the test keys in a predetermined period to detect defects of at least one MOS transistor among a plurality of MOS transistors of each of the test keys.

For each of the test key, the system 900 is configured to measure an IV curve of a plurality of MOS transistors which are included in the test key; compare the measured IV curve with a reference IV curve to obtain a first drain current drop in the linear region and a second drain current drop in the saturation region; and determine whether at least one of the MOS transistor among the MOS transistors of the test key is defected according to at least one of the first drain current drop and the second drain current drop.

According to some embodiments, a method for detecting defects on a semiconductor wafer is provided. The method measures an IV curve of a plurality of MOS transistors which are connected in series in a test key, where gate terminals of the MOS transistors are electrically isolated from corresponding drain terminals of the MOS transistors while source terminals of the MOS transistors are electrically connected to corresponding body terminals of the MOS transistors. The method compares the measured IV curve with a reference IV curve to obtain a first drain current drop in a linear region and a second drain current drop in a saturation region, and determines whether at least one MOS transistor among the MOS transistors of the test key is defected according to at least one of the first drain current drop and the second drain current drop.

According to some embodiments, a test line of a wafer monitoring system is provided. The test line includes a plurality of test keys electrically connected in parallel to each other. Each of the test keys comprises a plurality of MOS transistors electrically connected in series. Gate terminals of the MOS transistors are electrically isolated from corresponding drain terminals of the MOS transistors while source terminals of the MOS transistors are electrically connected to corresponding body terminals of the MOS transistors.

According to some embodiments, a wafer monitoring system for detecting defects on a semiconductor wafer is provided. The system includes a programmable processor and a memory which stores executable program instructions. The executable program instructions are configured, when executed by the programmable processor, to cause the system to perform: providing a test line which includes a plurality of test keys electrically connected in parallel, and sequentially testing each of the test keys in a predetermined period to detect defects of at least one MOS transistor among a plurality of MOS transistors of each of the test keys. For each of the test key, the system performs measuring a current-voltage (IV) curve of a plurality of metal oxide semiconductor (MOS) transistors which are connected in series in the test key, comparing the measured IV curve with a reference IV curve to obtain a first drain current drop in a linear region and a second drain current drop in a saturation region, and determining whether at least one of the MOS transistor among the MOS transistors of the test key is defected according to at least one of the first drain current drop and the second drain current drop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer defect detection method adapted to a wafer monitoring system, the method comprising:
   measuring a current-voltage (IV) curve of a plurality of metal oxide semiconductor (MOS) transistors which are connected in series in a test key, wherein gate terminals of the MOS transistors are electrically isolated from corresponding drain terminals of the MOS transistors while source terminals of the MOS transistors are electrically connected to corresponding body terminals of the MOS transistors;
   comparing the measured IV curve with a reference IV curve to obtain a first drain current drop in a linear region and a second drain current drop in a saturation region, wherein the first and second drain current drops are determined according to a ratio of drain current of the reference IV curve and a corresponding drain current in measured IV curve; and
   determining whether at least one MOS transistor among the MOS transistors of the test key is defected according to at least one of the first drain current drop and the second drain current drop, comprising:
   determining that there is a void in at least one of the MOS transistors in the test key in response to determining that the first drain current drop of a first MOS transistor among the plurality of MOS transistors is greater than a first threshold value and the second drain current drop of the first MOS transistor is smaller than a second threshold value, wherein the first threshold value is greater than the second threshold value,
   wherein a number of the MOS transistors in the test key is determined according to a calculated order of the drain current drop by using a chart recording a relation between the order of a drain current drop detected by applying a gate voltage to a gate terminal of each of the MOS transistors in the test key and the number of the MOS transistors in the test key.

2. The wafer defect detection method of claim 1, wherein the step of measuring the IV curve of the plurality of MOS transistors which are connected in series in the test key comprises:
   respectively measuring the IV curve of the plurality of MOS transistors in the linear region and in the saturation region.

3. The wafer defect detection method of claim 1, wherein the determined number of the MOS transistors corresponds to the order of the drain current drop having an observability over a predetermined level, wherein the observability represents a change of a drain current capable of being observed.

4. The wafer defect detection method of claim 1, wherein the order of the drain current drop is obtained by performing a logarithm operation on a ratio of a first drain current to a second drain current, wherein the first drain current is measured when none of the MOS transistors in the test key is defected, and the second drain current is measured when at least one of the MOS transistors in the test key is defected.

5. The wafer defect detection method of claim 1, wherein the step of determining whether the at least one MOS transistor among the MOS transistors of the test key is defected according to at least one of the first drain current drop and the second drain current drop comprises:
   determining that a gate terminal of at least one of the MOS transistors in the test key is opened in response to determining that the first drain current drop is smaller than the first threshold value and the second drain current drop is greater than the second threshold value, wherein the first threshold value is smaller than the second threshold value.

6. The wafer defect detection method of claim 1, wherein the step of determining whether the at least one MOS transistor among the MOS transistors of the test key is defected according to at least one of the first drain current drop and the second drain current drop comprises:
   determining that at least one of the MOS transistor is defected due to internal connection resistance among the MOS transistors in response to determining that the first drain current drop is greater than the first threshold value and the second drain current drop is greater than the second threshold value.

7. The wafer defect detection method of claim 1, further comprising:
   sequentially testing a plurality of test keys in a test line, wherein the test keys in the test line are connected in parallel.

8. The wafer defect detection method of claim 7, wherein the testing is performed by sequentially enabling a plurality of D flip-flops respectively connected to the test keys.

9. A test line of a wafer monitoring system, the test line comprising:
   a plurality of test keys electrically connected in parallel, wherein each of the test keys comprises a plurality of MOS transistors electrically connected in series, and gate terminals of the MOS transistors are electrically isolated from corresponding drain terminals of the MOS transistors while source terminals of the MOS transistors are electrically connected to corresponding body terminals of the MOS transistors, wherein
   a current-voltage (IV) curve of the plurality of MOS transistors in each of the test keys is measured and compared with a reference IV curve to obtain a first drain current drop in a linear region and a second drain current drop in a saturation region, wherein the first and second drain current drops are determined according to a ratio of drain current of the reference IV curve and a corresponding drain current in measured IV curve, and wherein
   a void in at least one of the MOS transistors in the test key is determined in response to determining that the first drain current drop of a first MOS transistor among the plurality of MOS transistors is greater than a first threshold value and the second drain current drop of the first MOS transistor is smaller than a second threshold value, wherein the first threshold value is greater than the second threshold value, wherein
   a number of the MOS transistors in each of the test keys is determined according to a calculated order of the drain current drop by using a chart recording a relation between the order of a drain current drop detected by applying a gate voltage to the gate terminal of each of the MOS transistors in the test key and the number of the MOS transistors in the test key.

10. The test line of the wafer monitoring system of claim 9, wherein the determined number of the MOS transistors corresponds to the order of the drain current drop having an observability over a predetermined level, wherein the observability represents a change of a drain current capable of being observed.

11. The test line of the wafer monitoring system of claim 9, wherein the order of the drain current drop is obtained by performing a logarithm operation on a ratio of a first drain current to a second drain current, wherein the first drain current is measured when none of the MOS transistors in the test key is defected, and the second drain current is measured when at least one of the MOS transistors in the test key is defected.

12. The test line of the wafer monitoring system of claim 9, further comprising:
   a plurality of D flip-flops respectively connected to the test keys being controlled by a controller to sequentially enable the plurality of D flip-flops to test the plurality of test keys.

13. The test line of the wafer monitoring system of claim 9, wherein the IV curve of the plurality of MOS transistors in the linear region and in the saturation region are respectively measured.

14. A wafer monitoring system for detecting defects on a semiconductor wafer, the system including a programmable processor and a memory which stores executable program instructions, the executable program instructions are configured, when executed by the programmable processor, to cause the system to perform:
   providing a test line which includes a plurality of test keys electrically connected in parallel, wherein a plurality of MOS transistors are connected in series in each of the test keys, gate terminals of the MOS transistors are electrically isolated from corresponding drain terminals of the MOS transistors, and source terminals of the MOS transistors are electrically connected to corresponding body terminals of the MOS transistors; and
   sequentially testing the test keys in a predetermined period to detect defects of at least one MOS transistor among the plurality of MOS transistors in each of the test keys,
   wherein for each of the test keys, the system performs:
   measuring a IV curve of the MOS transistors in the test key;
   comparing the measured IV curve with a reference IV curve to obtain a first drain current drop in a linear region and a second drain current drop in a saturation region, wherein the first and second drain current drops are determined according to a ratio of the drain current of the reference IV curve and a corresponding drain current in measured IV curve;
   determining whether at least one of the MOS transistor among the MOS transistors of the test key is defected according to at least one of the first drain current drop and the second drain current drop, comprising:
   determining that there is a void in at least one of the MOS transistors in the test key in response to determining that the first drain current drop of a first MOS transistor among the plurality of MOS transistors is greater than a first threshold value and the second drain current drop of the first MOS transistor is smaller than a second threshold value, wherein the first threshold value is greater than the second threshold value, wherein a number of the MOS transistors in the test key is determined according to a calculated order of the drain current drop by using a chart recording a relation between the order of a drain current drop detected by applying a gate voltage to a gate terminal of each of the MOS transistors in the test key and the number of the MOS transistors in the test key.

15. The wafer monitoring system for detecting defects on the semiconductor wafer of claim 14, wherein the programmable processor sequentially tests each of the test keys by sequentially enabling a plurality of D flip-flops respectively connected to the test keys.

16. The wafer monitoring system for detecting defects on the semiconductor wafer of claim 14, wherein the determined number of the MOS transistors corresponds to the order of the drain current drop having an observability over a predetermined level, wherein the observability represents a change of a drain current capable of being observed.

17. The wafer monitoring system for detecting defects on the semiconductor wafer of claim 14, wherein the order of the drain current drop is obtained by performing a logarithm operation on a ratio of a first drain current to a second drain current, wherein the first drain current is measured when none of the MOS transistors in the test key is defected, and the second drain current is measured when at least one of the MOS transistors in the test key is defected.

18. The wafer monitoring system for detecting defects on the semiconductor wafer of claim 14, wherein the system respectively measures the IV curve of the plurality of MOS transistors in the linear region and in the saturation region.

19. The wafer monitoring system for detecting defects on the semiconductor wafer of claim 14, wherein the system determines that a gate terminal of at least one of the MOS transistors in the test key is opened in response to determining that the first drain current drop is smaller than the first threshold value and the second drain current drop is greater than the second threshold value, wherein the first threshold value is smaller than the second threshold value.

20. The wafer monitoring system for detecting defects on the semiconductor wafer of 14, wherein the system determines that at least one of the MOS transistor is defected due to internal connection resistance among the MOS transistors in response to determining that the first drain current drop is greater than the first threshold value and the second drain current drop is greater than the second threshold value.

* * * * *